(12) United States Patent
Zhao (10) Patent No.: US 10,401,692 B2
(45) Date of Patent: Sep. 3, 2019

(54) THIN FILM TRANSISTOR ARRAY SUBSTRATE AND DISPLAY PANEL

(71) Applicant: SHENZHEN CHINA STAR OPTOELECTRONICS TECHNOLOGY CO., LTD., Shenzhen, Guangdong (CN)

(72) Inventor: Li Zhao, Guangdong (CN)

(73) Assignee: SHENZHEN CHINA STAR OPTOELECTRONICS TECHNOLOGY CO., LTD, Shenzhen, Guangdong (CN)

( * ) Notice: Subject to any disclaimer, the term of this patent is extended or adjusted under 35 U.S.C. 154(b) by 92 days.

(21) Appl. No.: 15/327,387

(22) PCT Filed: Jan. 13, 2017

(86) PCT No.: PCT/CN2017/071157
§ 371 (c)(1),
(2) Date: Jan. 19, 2017

(87) PCT Pub. No.: WO2018/120304
PCT Pub. Date: Jul. 5, 2018

(65) Prior Publication Data
US 2018/0224686 A1    Aug. 9, 2018

(30) Foreign Application Priority Data
Dec. 28, 2016 (CN) .......................... 2016 1 1237154

(51) Int. Cl.
*G02F 1/1343* (2006.01)
*G02F 1/1362* (2006.01)
(Continued)

(52) U.S. Cl.
CPC .... *G02F 1/13439* (2013.01); *G02F 1/133753* (2013.01); *G02F 1/134309* (2013.01);
(Continued)

(58) Field of Classification Search
CPC ............. G02F 1/1368; G02F 1/136286; G02F 1/134309; G02F 1/133707;
(Continued)

(56) References Cited

U.S. PATENT DOCUMENTS

| | | | |
|---|---|---|---|
| 2013/0194536 A1* | 8/2013 | Tae | ................... G02F 1/133707 349/143 |
| 2016/0246122 A1 | 8/2016 | Zheng | |

(Continued)

FOREIGN PATENT DOCUMENTS

| | | |
|---|---|---|
| CN | 104166283 A | 11/2014 |
| CN | 105137678 A | 12/2015 |
| CN | 106094369 A | 11/2016 |

*Primary Examiner* — Thoi V Duong
(74) *Attorney, Agent, or Firm* — Soroker Agmon Nordman (57) ABSTRACT

A thin film transistor array substrate and a display panel are provided. The thin film transistor array substrate includes a row of the pixel units and a column of the pixel units. The row of the pixel units includes at least two pixel units, and the column of the pixel units includes at least two pixel units. The pixel unit includes a trunk electrode, a connection electrode, and a strip electrode. The connection electrode is connected with the at least two strip electrodes. The connection electrode is used for increasing transmission of the pixel unit. The transmission of the pixel unit can be increased.

18 Claims, 8 Drawing Sheets

(51) Int. Cl.
  *H01L 27/12*  (2006.01)
  *G02F 1/1337*  (2006.01)
  *G02F 1/1368*  (2006.01)
(52) U.S. Cl.
  CPC .. *G02F 1/134336* (2013.01); *G02F 1/136286* (2013.01); *H01L 27/124* (2013.01); *G02F 1/1368* (2013.01); *G02F 2001/134345* (2013.01); *G02F 2201/122* (2013.01); *G02F 2201/123* (2013.01); *G02F 2203/01* (2013.01)
(58) Field of Classification Search
  CPC ......... G02F 1/134336; G02F 1/133514; G02F 1/134363; G02F 1/1362; G02F 2201/123; G02F 2201/122; G02F 2201/124; G02F 2001/134345; G02F 2001/133757; G02F 2001/1635; G02F 1/13439; G02F 1/133753; G02F 2203/01; H01L 27/326; H01L 27/3262; H01L 27/124
  See application file for complete search history.

(56) References Cited

U.S. PATENT DOCUMENTS

2017/0003554 A1*  1/2017  Kim .................. G02F 1/134309
2018/0217451 A1   8/2018  Yao et al.
2018/0335672 A1  11/2018  Ye

* cited by examiner

| first viewing angle | (Theta 0°, Phi 0°) | | |
|---|---|---|---|
| comparison object | conventional pixel unit | a pixel unit of a first embodiment of the present disclosure | a pixel unit of a second embodiment of the present disclosure |
| simulation effect | | | |
| transmission | 0.2485 | 0.2540 | 0.2540 |

| second viewing angle | (Theta 60°, Phi 0°) | | |
|---|---|---|---|
| comparison object | conventional pixel unit | a pixel unit of a first embodiment of the present disclosure | a pixel unit of a second embodiment of the present disclosure |
| simulation effect | | | |
| transmission | 0.1856 | 0.1900 | 0.1972 |

| third viewing angle | (Theta 60°, Phi 90°) | | |
|---|---|---|---|
| comparison object | conventional pixel unit | a pixel unit of a first embodiment of the present disclosure | a pixel unit of a second embodiment of the present disclosure |
| simulation effect | | | |
| transmission | 0.1856 | 0.1972 | 0.1900 |

THIN FILM TRANSISTOR ARRAY SUBSTRATE AND DISPLAY PANEL

FIELD OF THE DISCLOSURE

The present disclosure relates to a field of displays, and more particularly to a thin film transistor array substrate and a display panel.

BACKGROUND

A conventional thin film transistor array substrate is provided with pixel electrodes in pixel units. The pixel electrodes include a strip electrode and a trunk electrode.

The strip electrode is disposed in a pixel partition partitioned by the trunk electrode. The strip electrode is used to form a uniform electric field force in the pixel partition, otherwise the electric field force will gather in a local area of the pixel partition, such that the pixel electrode cannot make the electric field force be uniformly distributed in the pixel unit.

When used in practice, the inventor has found that the prior art has at least the following problems:

Since there is a gap between the two strip electrodes in the pixel partition, the electric field force of the pixel unit will be weakened by the gap, thereby decreasing transmission of the pixel unit.

Accordingly, it is necessary to provide a new technical solution to solve the technical problem in the prior art.

SUMMARY OF THE DISCLOSURE

An object of the present disclosure is to provide a thin film transistor array substrate and a display panel, where transmission of the pixel unit can be increased.

In order to solve the above problems, the present disclosure provides the following technical solutions.

A thin film transistor array substrate, comprising: at least two rows of pixel units arranged in a first direction in a form of an array, where the row of the pixel units comprise at least two pixel units which are arranged in a second direction in a form of an array; at least two columns of pixel units arranged in the second direction in a form of an array, where the column of the pixel units comprise the at least two pixel units which are arranged in the first direction in a form of an array; where the pixel unit comprises: a trunk electrode, the pixel unit being divided into at least four pixel partitions by the trunk electrode; at least four strip electrode arrays, disposed on the pixel partitions, and comprising at least two strip electrodes; and at least four connection electrodes, disposed on the pixel partitions, and connected with at least two of the strip electrodes on the pixel partitions, and the connection electrodes used for increasing transmission of the pixel unit; at least two scan lines; and at least two data lines; where the scan lines and the data lines are connected with the pixel unit, the first direction is parallel to the data lines, and the second direction is parallel to the scan lines, in the pixel partition, an angle between a length direction of the connection electrode and a length direction of the strip electrode is in a range of 1 degree and 89 degrees.

In the above-mentioned thin film transistor array substrate, the length direction of the connection electrode is parallel to the first direction.

In the above-mentioned thin film transistor array substrate, the length direction of the connection electrode is parallel to the second direction.

In the above-mentioned thin film transistor array substrate, length directions of the connection electrodes in any two of the pixel units in the same row of the pixel units are the same, and the length directions of the connection electrodes in any two of the pixel units in the same column of the pixel units are the same; or the length directions of the connection electrodes in any two of the pixel units in the same row of the pixel units are the same, and the length directions of the connection electrodes in any two of the pixel units in the same column of the pixel units are perpendicular to each other; or the length directions of the connection electrodes in any two of the pixel units in the same row of the pixel units are perpendicular to each other, and the length directions of the connection electrodes in any two of the pixel units in the same column of the pixel units are perpendicular to each other.

A thin film transistor array substrate, comprising: at least two rows of pixel units arranged in a first direction in a form of an array, where the row of the pixel units comprise at least two pixel units arranged in a second direction in a form of an array; at least two columns of pixel units arranged in the second direction in a form of an array, where the column of the pixel units comprise the at least two pixel units arranged in the first direction in a form of an array; where the pixel unit comprises: a trunk electrode, the pixel unit being divided into at least four pixel partitions by the trunk electrode; at least four strip electrode arrays, disposed on the pixel partitions, and comprising at least two strip electrodes; and at least four connection electrodes, disposed on the pixel partitions, and connected with at least two of the strip electrodes on the pixel partitions, and the connection electrodes used for increasing transmission of the pixel unit.

In the above-mentioned thin film transistor array substrate, in the pixel partition, an angle between a length direction of the connection electrode and a length direction of the strip electrode is in a range of 1 degree and 89 degrees.

In the above-mentioned thin film transistor array substrate, the angle is 45 degrees.

In the above-mentioned thin film transistor array substrate, the length direction of the connection electrode is parallel to the first direction.

In the above-mentioned thin film transistor array substrate, the length direction of the connection electrode is parallel to the second direction.

In the above-mentioned thin film transistor array substrate, length directions of the connection electrodes in any two of the pixel units in the same row of the pixel units are the same, and the length directions of the connection electrodes in any two of the pixel units in the same column of the pixel units are the same; or the length directions of the connection electrodes in any two of the pixel units in the same row of the pixel units are the same, and the length directions of the connection electrodes in any two of the pixel units in the same column of the pixel units are perpendicular to each other; or the length directions of the connection electrodes in any two of the pixel units in the same row of the pixel units are perpendicular to each other, and the length directions of the connection electrodes in any two of the pixel units in the same column of the pixel units are perpendicular to each other.

In the above-mentioned thin film transistor array substrate, the connection electrode is used for increasing a total area occupied by a pixel electrode in the pixel unit, thereby increasing an electric field force applied by the pixel electrode to a liquid crystal molecule in a liquid crystal layer.

In the above-mentioned thin film transistor array substrate, the connection electrode is also used for reducing electric field interference between any two of the strip electrodes in the pixel partition.

A display panel, comprising: a color film substrate; a liquid crystal layer; a thin film transistor array substrate, comprising: at least two rows of pixel units arranged in a first direction in a form of an array, where the row of the pixel units comprise at least two pixel units arranged in a second direction in a form of an array; at least two columns of pixel units arranged in the second direction in a form of an array, where the column of the pixel units comprise the at least two pixel units arranged in the first direction in a form of an array; where the pixel unit comprises: a trunk electrode, the pixel unit being divided into at least four pixel partitions by the trunk electrode; at least four strip electrode arrays, disposed on the pixel partitions, and comprising at least two strip electrodes; and at least four connection electrodes, disposed on the pixel partitions, and connected with at least two of the strip electrodes on the pixel partitions, and the connection electrodes used for increasing transmission of the pixel unit.

In the above-mentioned display panel, in the pixel partition, an angle between a length direction of the connection electrode and a length direction of the strip electrode is in a range of 1 degree and 89 degrees.

In the above-mentioned display panel, the angle is 45 degrees.

In the above-mentioned display panel, the length direction of the connection electrode is parallel to the first direction.

In the above-mentioned display panel, the length direction of the connection electrode is parallel to the second direction.

In the above-mentioned display panel, length directions of the connection electrodes in any two of the pixel units in the same row of the pixel units are the same, and the length directions of the connection electrodes in any two of the pixel units in the same column of the pixel units are the same; or the length directions of the connection electrodes in any two of the pixel units in the same row of the pixel units are the same, and the length directions of the connection electrodes in any two of the pixel units in the same column of the pixel units are perpendicular to each other; or the length directions of the connection electrodes in any two of the pixel units in the same row of the pixel units are perpendicular to each other, and the length directions of the connection electrodes in any two of the pixel units in the same column of the pixel units are perpendicular to each other.

In the above-mentioned display panel, the connection electrode is used for increasing a total area occupied by a pixel electrode in the pixel unit, thereby increasing an electric field force applied by the pixel electrode to liquid crystal molecule in a liquid crystal layer.

In the above-mentioned display panel, the connection electrode is also used for reducing electric field interference between any two of the strip electrodes in the pixel partition.

In comparison to the prior art, since the total area occupied by the pixel electrode in the pixel unit is increased by the connection electrode of the present disclosure, the electric field force applied by the pixel electrode to the liquid crystal molecule in the liquid crystal layer can be increased, so that transmission of the pixel unit is improved in the case where an aperture ratio of the pixel unit is constant.

In order to make the present disclosure more clear, preferred embodiments and the drawings thereof are described in detail below.

DETAILED DESCRIPTION

Regarding the terms used in this specification, "one embodiment" or "an embodiment" means that the description in connection with the embodiment serves as an example, instance, or illustration of the disclosure. Furthermore, the articles "a" and "an" as used in this specification and the appended claims should generally be construed to mean "one or multiple", unless specified or clear from context to be directed to be a singular form.

Display panels of the present disclosure may be TFT-LCD (thin film transistor liquid crystal display), etc.

In the first embodiment of the present disclosure, a display panel includes a color film substrate, a liquid crystal layer, and a thin film transistor array substrate. The liquid crystal layer is disposed between the color film substrate and the thin film transistor array substrate.

Figure 1:
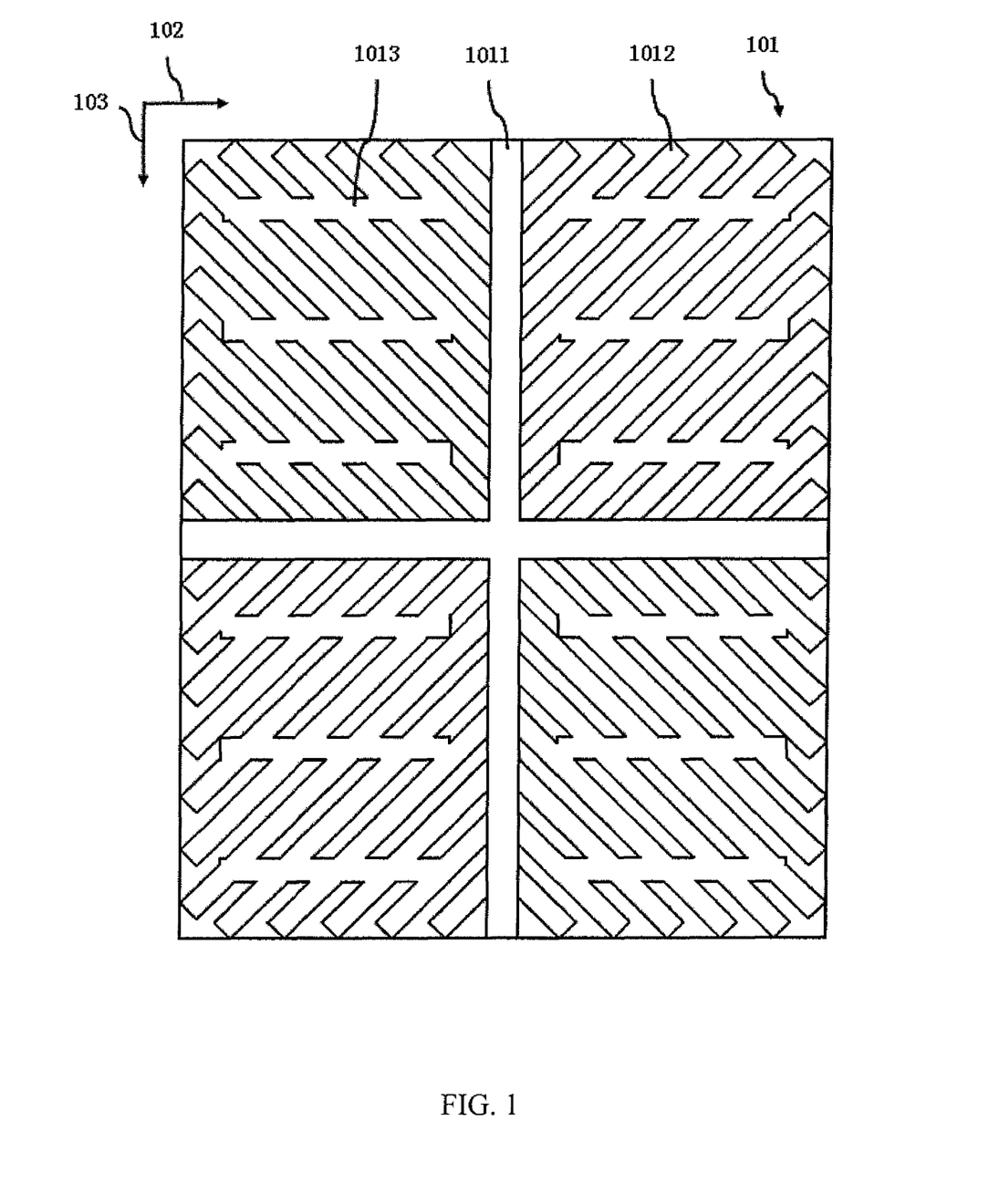
FIG. 1 is a schematic diagram of a pixel unit of a thin film transistor array substrate according to a first embodiment of the present disclosure.
Figure 3:
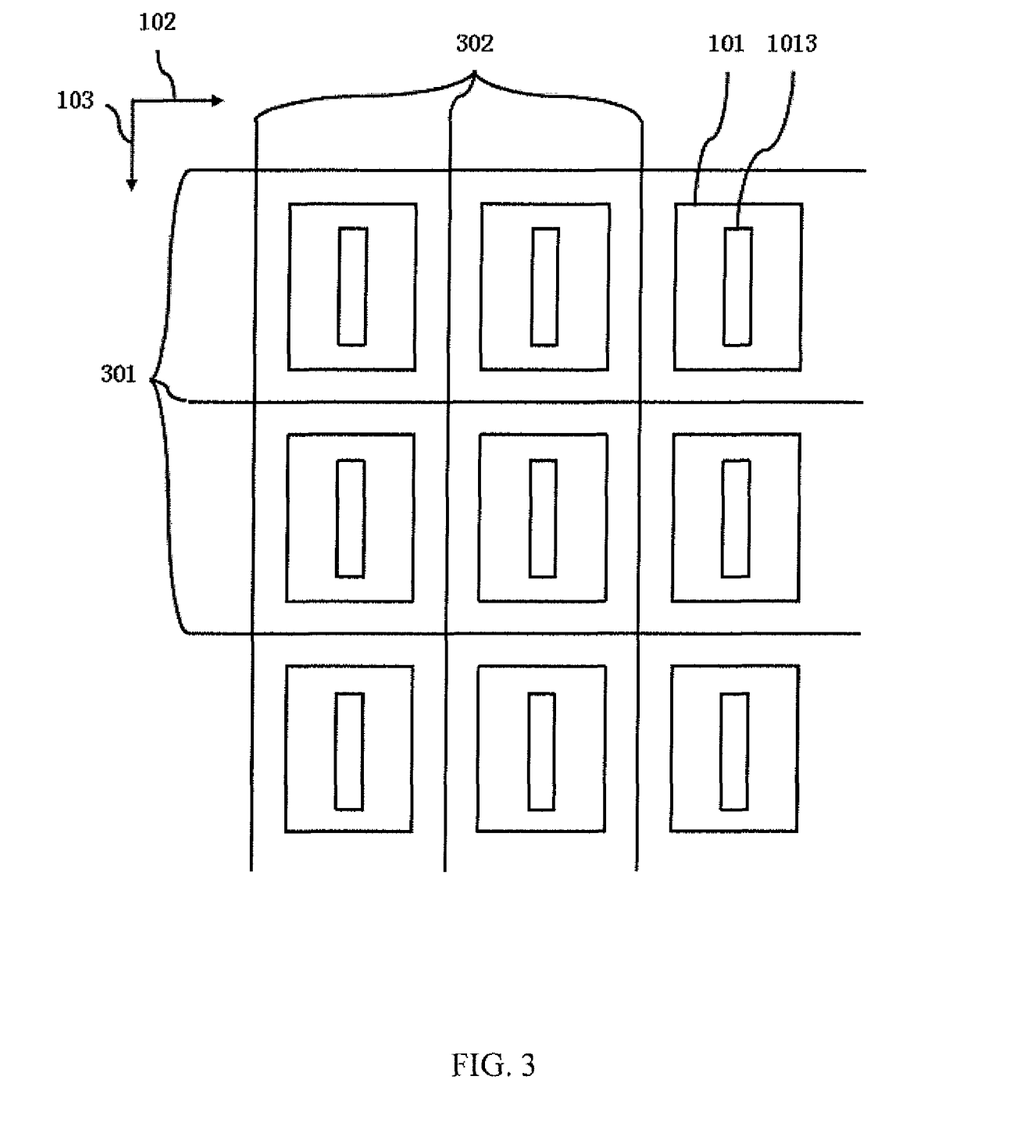
FIG. 3 to FIG. 5 are schematic diagrams showing three different arrangements of a pixel unit of a thin film transistor array substrate of the present disclosure.
Figure 4:
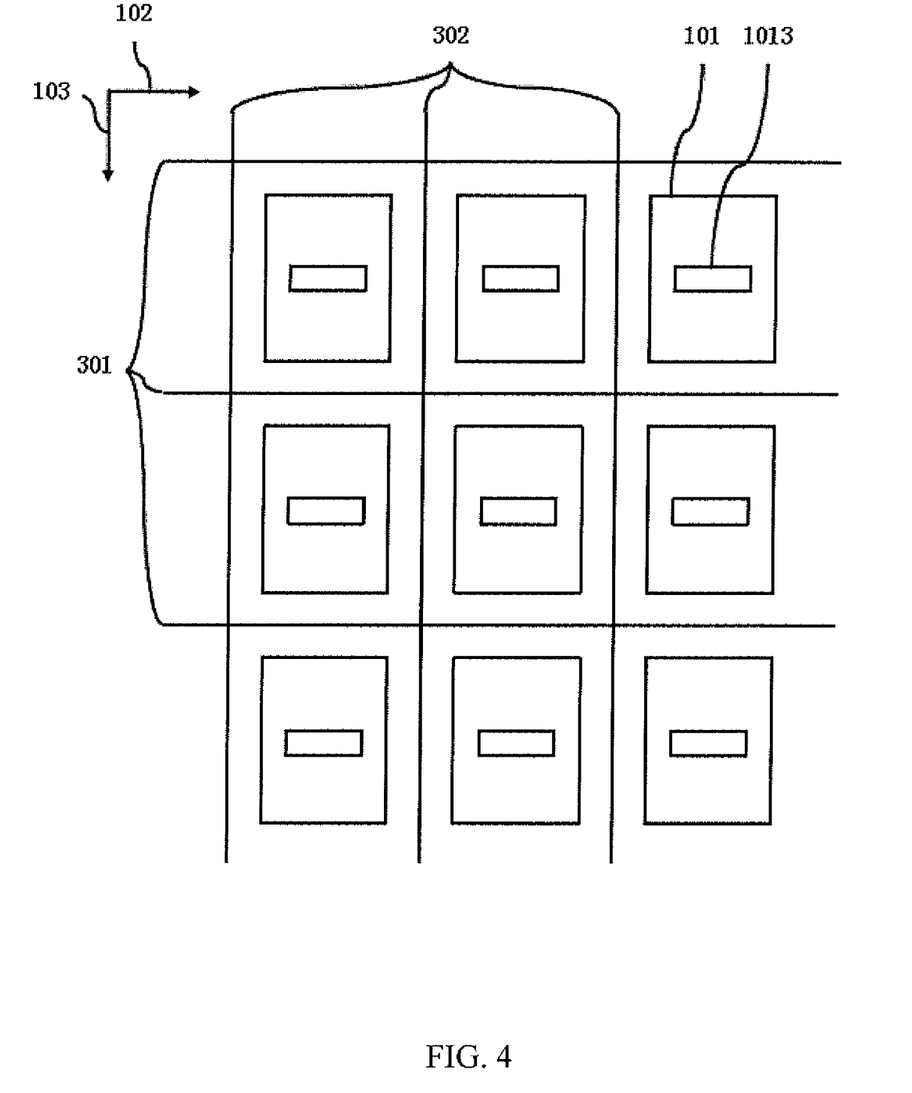
Figure 5:
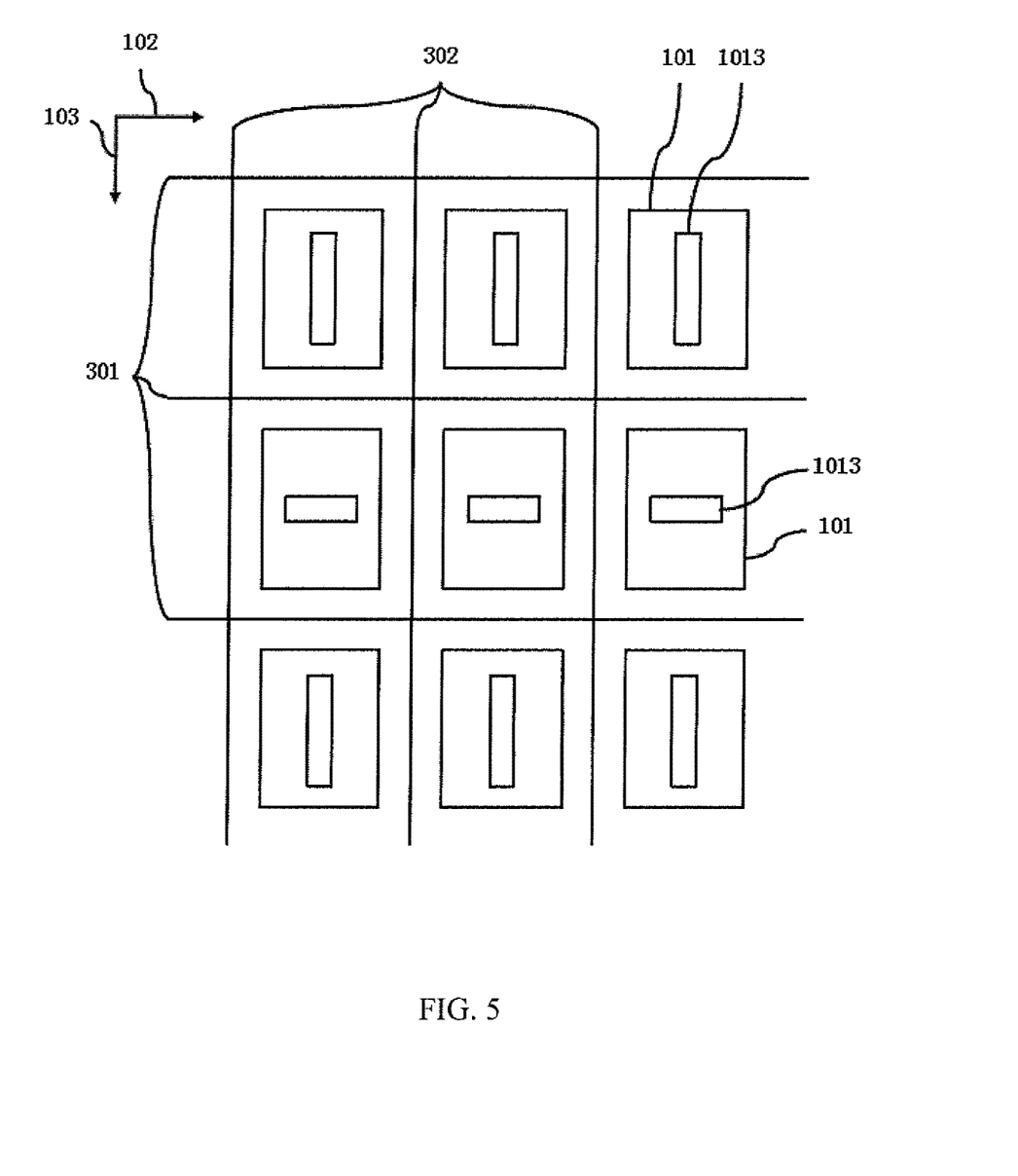

Refer to FIG. 1 and FIG. 3 to FIG. 5. FIG. 1 is a schematic diagram of a pixel unit 101 of a thin film transistor array substrate according to a first embodiment of the present disclosure. FIG. 3 to FIG. 5 are schematic diagrams showing three different arrangements of a pixel unit 101 of a thin film transistor array substrate of the present disclosure.

The thin film transistor array substrate includes at least two scan lines 301, at least two data lines 302, at least two rows of pixel units, and at least two columns of pixel units.

The at least two rows of pixel units are arranged in a first direction 103 in a form of an array. The row of the pixel units comprise at least two pixel units 101, and the at least two pixel units 101 of the row of the pixel units are arranged in a second direction 102 in a form of an array. The first direction 103 is parallel to the data line 302, and the second direction 102 is parallel to the scan line 301.

The at least two columns of pixel units are arranged in the second direction 102 in a form of an array. The column of the pixel units includes the at least two pixel units 101. The at least two pixel units 101 of the column of the pixel units are arranged in the first direction 103 in a form of an array.

The scan line 301 and the data line 302 are connected with the pixel unit 101. The pixel unit 101 includes a trunk electrode 1011, at least four strip electrode 1012 arrays, and at least four connection electrodes 1013.

The pixel unit 101 is divided into at least four pixel partitions by the trunk electrode 1011. The strip electrode 1012 array is disposed on the pixel partition. The strip electrode 1012 array includes at least two strip electrodes 1012. The connection electrode 1013 is disposed on the pixel partition. The connection electrode 1013 is connected with at least two the strip electrodes 1012 in the pixel partition. The connection electrode 1013 is used for increasing transmission of the pixel unit 101. Specifically, the connection electrode 1013 is used for increasing a total area occupied by a pixel electrode in the pixel unit 101, so as to increase an electric field force applied by the pixel electrode to liquid crystal molecule in a liquid crystal layer, thereby increasing transmission of the pixel unit 101.

The connection electrode 1013 is also used for reducing electric field interference between any two of the strip electrodes 1012 in the pixel partition.

In the thin film transistor array substrate of this embodiment, in the pixel partition, an angle between a length direction of the connection electrode 1013 and a length direction of the strip electrode 1012 is in a range of 1 degree and 89 degrees. For example, the angle is 1 degree, 5 degrees, 9 degrees, 13 degrees, 17 degrees, 21 degrees, 25 degrees, 29 degrees, 33 degrees, 37 degrees, 41 degrees, 45 degrees, 49 degrees, 53 degrees, 57 degrees, 61 degrees, 65 degrees, 69 degrees, 73 degrees, 77 degrees, 81 degrees, 85 degrees, and 89 degrees. Preferably, the angle is 45 degrees.

In the four pixel partitions of the pixel unit 101, the length directions of the connection electrodes 1013 are the same.

In the thin film transistor array substrate of this embodiment, the length direction of the connection electrode 1013 is parallel to the second direction 102.

In the thin film transistor array substrate of this embodiment, length directions of the connection electrodes 1013 in any two of the pixel units 101 in the same row of the pixel units are the same, and the length directions of the connection electrodes 1013 in any two of the pixel units 101 in the same column of the pixel units are the same.

Or, the length directions of the connection electrodes 1013 in any two of the pixel units 101 in the same row of the pixel units are the same, and the length directions of the connection electrodes 1013 in any two of the pixel units 101 in the same column of the pixel units are perpendicular to each other.

Or, the length directions of the connection electrodes 1013 in any two of the pixel units 101 in the same row of the pixel units are perpendicular to each other, and the length directions of the connection electrodes 1013 in any two of the pixel units 101 in the same column of the pixel units are perpendicular to each other.

Figure 2:
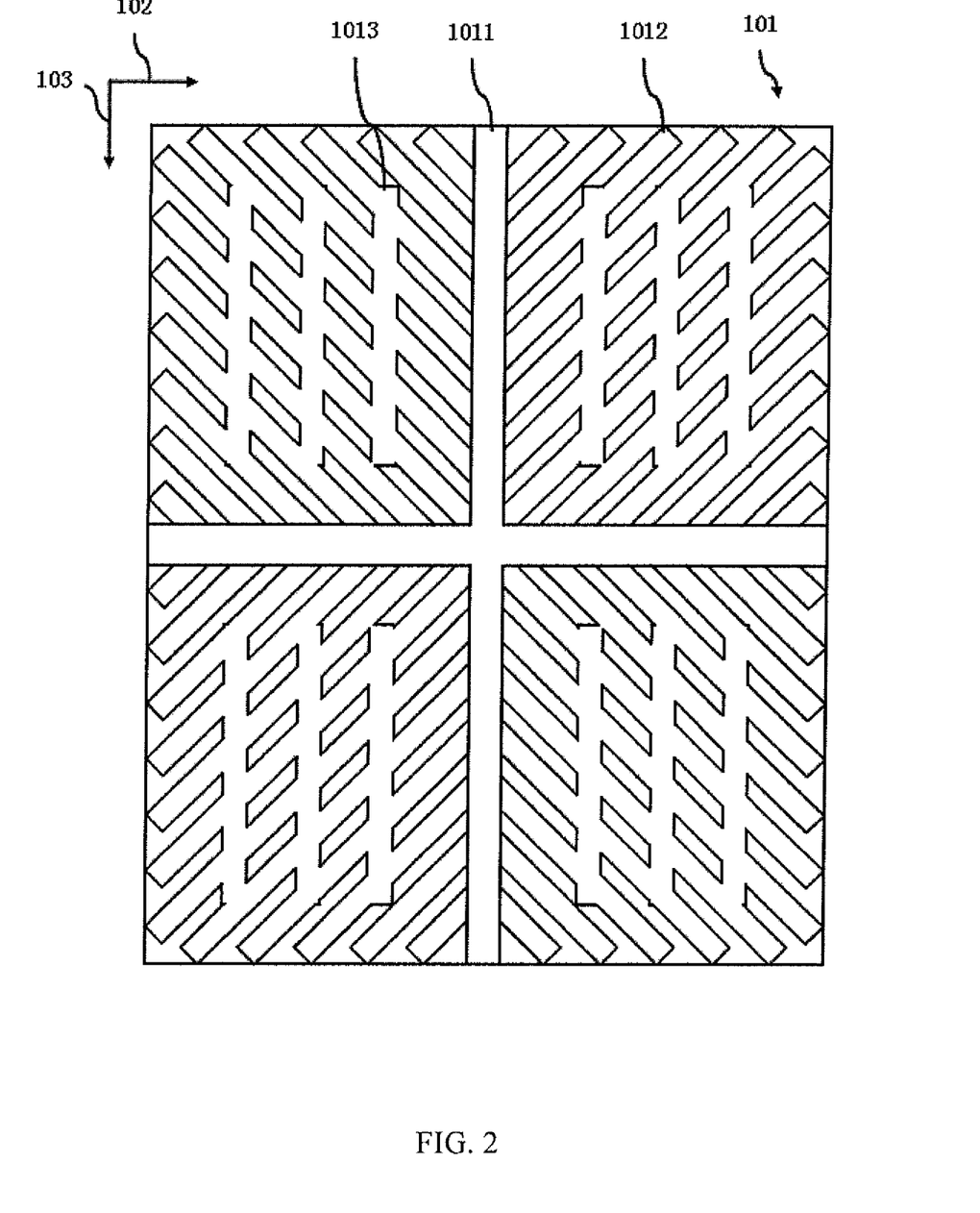
FIG. 2 is a schematic diagram of a pixel unit of a thin film transistor array substrate according to a second embodiment of the present disclosure.

FIG. 2 is a schematic diagram of a pixel unit 101 of a thin film transistor array substrate according to a second embodiment of the present disclosure.

The second embodiment of the display panel of the present disclosure is similar to the above-described first embodiment, the difference is:

The length direction of the connection electrode 1013 is parallel to the first direction 103.

Figure 6:
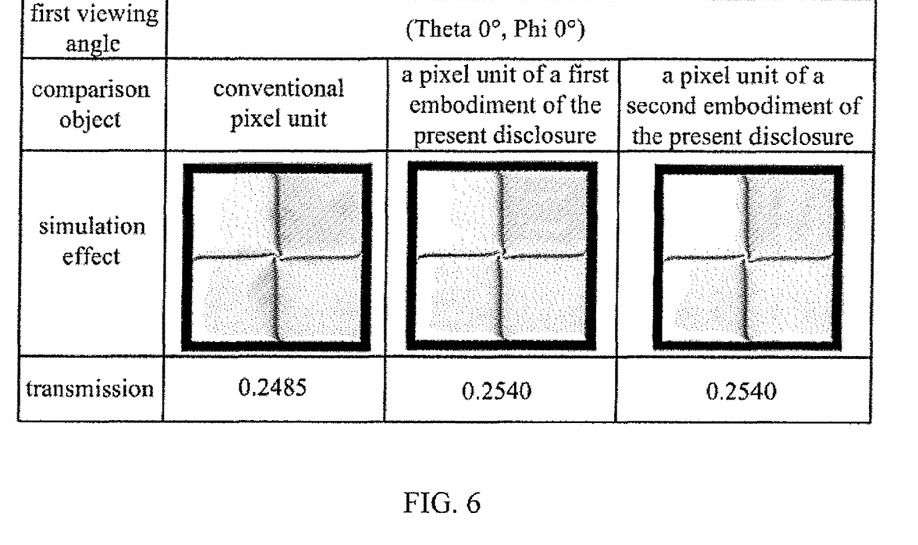
FIG. 6 is a schematic diagram showing comparisons of a simulation effect and transmission between the pixel units of the thin film transistor array substrate of the first and second embodiments of the present disclosure and the conventional pixel unit from a first viewing angle.

FIG. 6 is a schematic diagram showing comparisons of a simulation effect and transmission between the pixel units 101 of the thin film transistor array substrate of the first and second embodiments of the present disclosure and the conventional pixel unit from a first viewing angle (Theta 0°, Phi 0°). Theta 0° means that an angle between a line of sight corresponding to the first viewing angle and a normal line of the thin film transistor array substrate is 0°. Phi 0° means that an angle between the line of sight corresponding to the first viewing angle and a long side direction or a short side direction of the thin film transistor array substrate is 0°.

In FIG. 6, from the first viewing angle, in the first embodiment of the present disclosure, the transmission of the pixel unit 101 is 0.2540, which is 2.2% higher than the transmission of the conventional pixel unit, which is 0.2485. Also, from the first viewing angle, in the second embodiment of the present disclosure, the transmission of the pixel unit 101 is 0.2540, which is 2.2% higher than the transmission of the conventional pixel unit, which is 0.2485.

Figure 7:
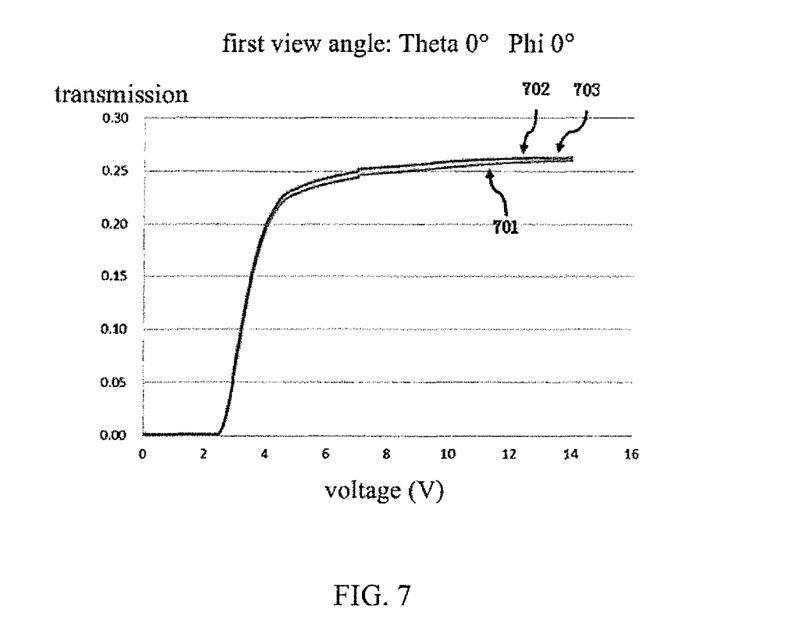
FIG. 7 is a schematic diagram showing a relationship of transmission and voltage between the pixel units of the thin film transistor array substrate of the first and second embodiments of the present disclosure and the conventional pixel unit from the first viewing angle.

FIG. 7 is a schematic diagram showing a relationship of transmission and voltage between the pixel units 101 of the thin film transistor array substrate of the first and second embodiments of the present disclosure and the conventional pixel unit from the first viewing angle (Theta 0°, Phi 0°). From the first viewing angle, if voltage applied to the pixel electrode is in a range of 5 voltage (V) and 14 V, transmission 702 of the pixel unit 101 in the first embodiment of the present disclosure and transmission 703 of the pixel unit 101 in the second embodiment of the present disclosure are higher than transmission 701 of the conventional pixel unit.

Figure 8:
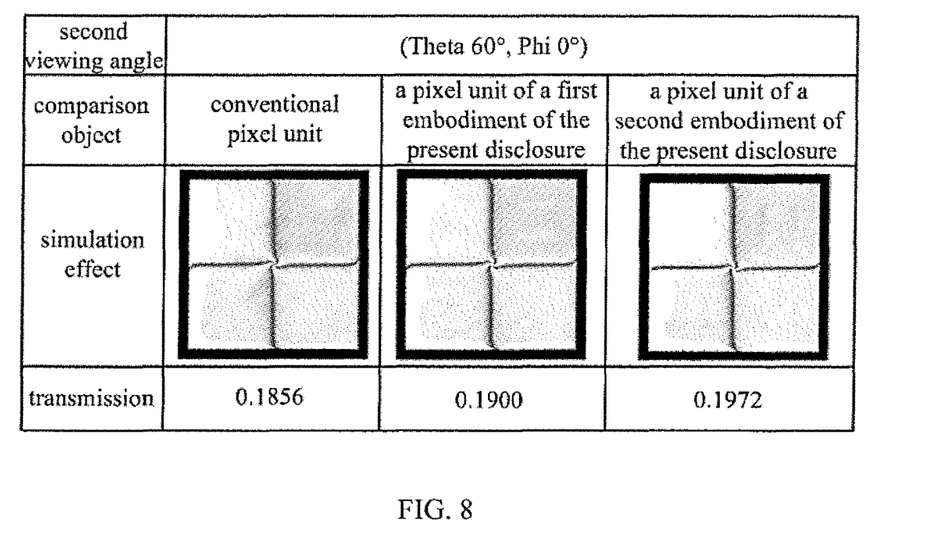
FIG. 8 is a schematic diagram showing comparisons of a simulation effect and transmission between the pixel units of the thin film transistor array substrate of the first and second embodiments of the present disclosure and the conventional pixel unit from a second viewing angle.

FIG. 8 is a schematic diagram showing comparisons of a simulation effect and transmission between the pixel units 101 of the thin film transistor array substrate of the first and second embodiments of the present disclosure and the conventional pixel unit from a second viewing angle (Theta 60°, Phi 0°). Theta 60° means that an angle between a line of sight corresponding to the second viewing angle and the normal line of the thin film transistor array substrate is 60°. Phi 0° means that an angle between the line of sight corresponding to the second viewing angle and the long side direction or the short side direction of the thin film transistor array substrate is 0°.

In FIG. 8, from the second viewing angle, in the first embodiment of the present disclosure, the transmission of the pixel unit 101 is 0.1900, which is 2.37% higher than the transmission of the conventional pixel unit, which is 0.1856. Also, from the second viewing angle, in the second embodiment of the present disclosure, the transmission of the pixel unit 101 is 0.1972, which is 6.25% higher than the transmission of the conventional pixel unit, which is 0.1856.

Figure 9:
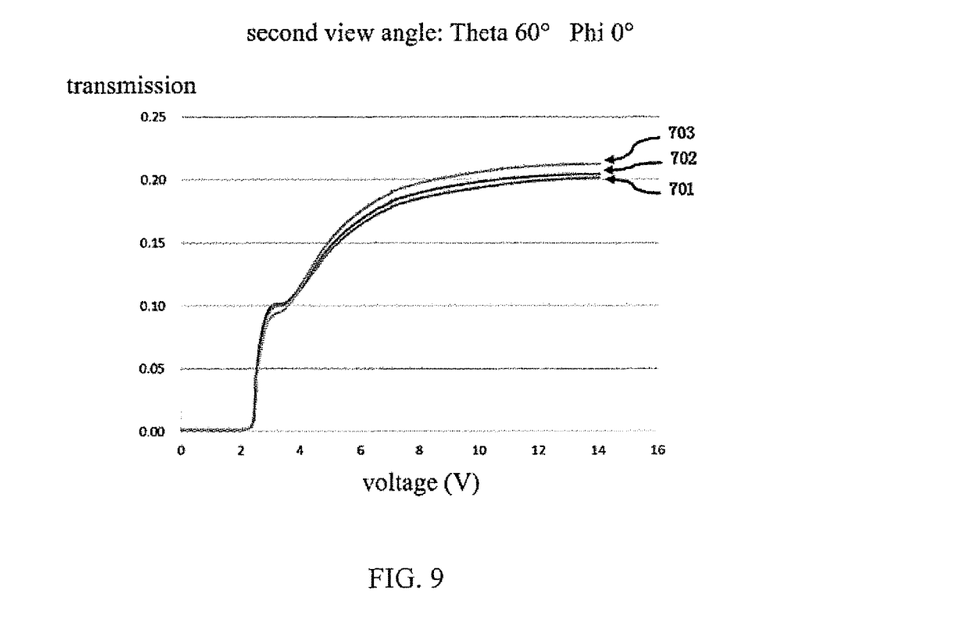
FIG. 9 is a schematic diagram showing a relationship of transmission and voltage between the pixel units of the thin film transistor array substrate of the first and second embodiments of the present disclosure and the conventional pixel unit from the second viewing angle.

FIG. 9 is a schematic diagram showing a relationship of transmission and voltage between the pixel units 101 of the thin film transistor array substrate of the first and second embodiments of the present disclosure and the conventional pixel unit from the second viewing angle (Theta 60°, Phi 0°). From the second viewing angle, if voltage applied to the pixel electrode is in a range of 5 V and 14 V, transmission 703 of the pixel unit 101 in the second embodiment of the present disclosure is higher than transmission 702 of the pixel unit 101 in the first embodiment of the present disclosure, and the transmission 702 of the pixel unit 101 in the first embodiment of the present disclosure is higher than the transmission 701 of the conventional pixel unit.

Figure 10:
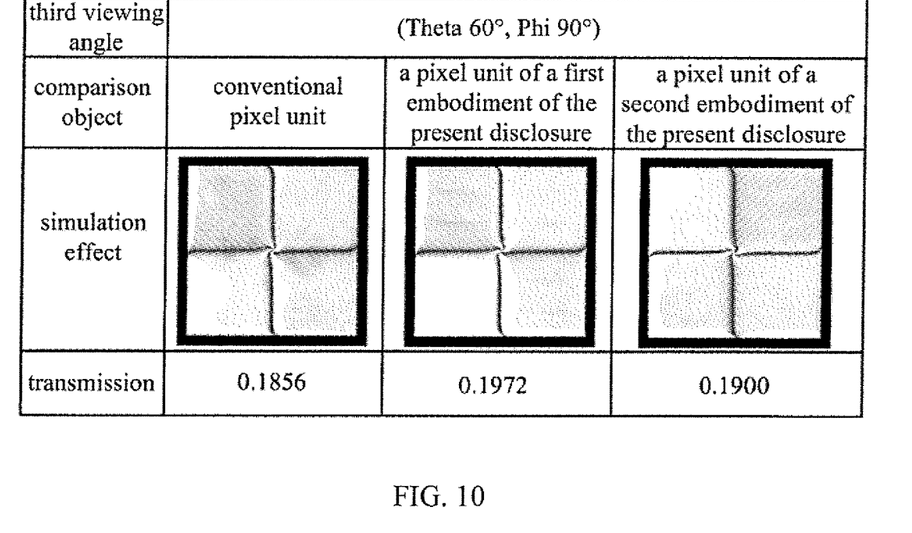
FIG. 10 is a schematic diagram showing comparisons of a simulation effect and transmission between the pixel units of the thin film transistor array substrate of the first and second embodiments of the present disclosure and the conventional pixel unit from a third viewing angle.

FIG. 10 is a schematic diagram showing comparisons of a simulation effect and transmission between the pixel units 101 of the thin film transistor array substrate of the first and second embodiments of the present disclosure and the conventional pixel unit from a third viewing angle (Theta 60°, Phi 90°). Theta 60° means that an angle between a line of sight corresponding to the third viewing angle and the normal line of the thin film transistor array substrate is 60°. Phi 90° means that an angle between the line of sight corresponding to the third viewing angle and the long side direction or the short side direction of the thin film transistor array substrate is 90°

In FIG. 10, from the third viewing angle, in the first embodiment of the present disclosure, the transmission of the pixel unit 101 is 0.1972, which is 6.25% higher than the transmission of the conventional pixel unit, which is 0.1856. Also, from the third viewing angle, in the second embodiment of the present disclosure, the transmission of the pixel unit 101 is 0.1900, which is 2.37% higher than the transmission of the conventional pixel unit, which is 0.1856.

Figure 11:
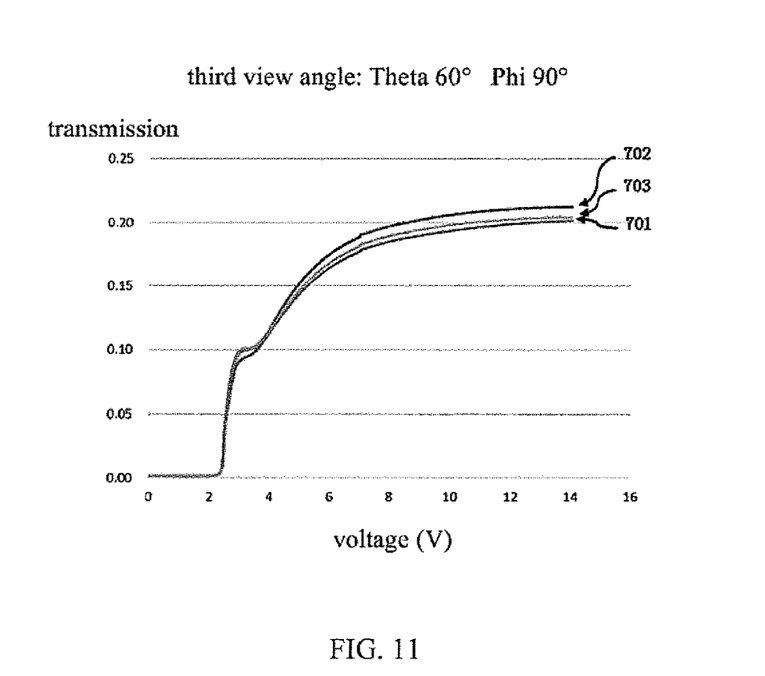
FIG. 11 is a schematic diagram showing a relationship of transmission and voltage between the pixel units of the thin film transistor array substrate of the first and second embodiments of the present disclosure and the conventional pixel unit from the third viewing angle.

FIG. 11 is a schematic diagram showing a relationship of transmission and voltage between the pixel units 101 of the thin film transistor array substrate of the first and second embodiments of the present disclosure and the conventional pixel unit from the third viewing angle (Theta 60°, Phi 90°). From the third viewing angle, if voltage applied to the pixel electrode is in a range of 5 V and 14 V, the transmission 702 of the pixel unit 101 in the first embodiment of the present disclosure is higher than the transmission 703 of the pixel unit 101 in the second embodiment of the present disclosure, and the transmission 703 of the pixel unit 101 in the second embodiment of the present disclosure is higher than the transmission 701 of the conventional pixel unit.

The third embodiment of the display panel of the present disclosure is similar to the first or second embodiment described above, the difference is:

In the pixel unit 101, the length directions of the connection electrodes 1013 of two adjacent pixel partitions in the first direction 103 and the second direction 102 are perpendicular to each other.

According to the above-described technical solutions, since the connection electrode 1013 increases the total area occupied by the pixel electrode in the pixel unit 101, the electric field action applied by the pixel electrode to the liquid crystal molecule of the liquid crystal layer can be increased. Hence, the transmission of the pixel unit 101 can be improved in the case that the aperture ratio of the pixel unit 101 is constant. In addition, the present disclosure is also advantageous to improving the color shift problem occurring from the large viewing angle of the display panel.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A thin film transistor array substrate, comprising:
   at least two rows of pixel units arranged in a first direction in a form of an array, wherein the row of the pixel units comprise at least two pixel units, which are arranged in a second direction in a form of an array;
   at least two columns of pixel units arranged in the second direction in a form of an array, wherein the column of the pixel units comprise the at least two pixel units, which are arranged the first direction in a form of an array;
   wherein the pixel unit comprises:
      a trunk electrode, the pixel unit being divided into at least four pixel partitions by the trunk electrode;
      at least four strip electrode arrays, disposed on the pixel partitions, and comprising at least two strip electrodes; and
      at least four connection electrodes, disposed on the pixel partitions, and connected with at least two of the strip electrodes on the pixel partitions, and the connection electrodes used for increasing transmission of the pixel unit, wherein the strip electrode in each pixel partition extends from the trunk electrode toward a periphery of the pixel partition, and the connection electrode in each pixel partition is separated from the periphery of the pixel partition by a distance;
   at least two scan lines; and
   at least two data lines;
   wherein the scan lines and the data line are connected with the pixel unit, the first direction is parallel to the data lines, and the second direction is parallel to the scan lines, in the pixel partition, an angle between a length direction of the connection electrode and length direction of the snip electrode is in a range of 1 degree and 89 degrees.

2. The thin film transistor array substrate as claimed in claim 1, wherein the length direction of the connection electrode is parallel to the first direction.

3. The thin film transistor array substrate as claimed in claim 1, wherein the length direction of the connection electrode is parallel to the second direction.

4. The thin film transistor array substrate as claimed in claim 1, wherein length directions of the connection electrodes in any two of the pixel units in the same row of the pixel units are the same, and the length directions of the connection electrodes in any two of the pixel units in the same column of the pixel units are the same; or
   the length directions of the connection electrodes in any two of the pixel units in the same row of the pixel units are the same, and the length directions of the connection electrodes in any two of the pixel units in the same column of the pixel units are perpendicular to each other; or
   the length directions of the connection electrodes in any two of the pixel units in the same row of the pixel units are perpendicular to each other, and the length directions of the connection electrodes in any two of the pixel units in the same column of the pixel units are perpendicular to each other.

5. A thin film transistor array substrate, comprising:
   at least two rows of pixel units arranged in a first direction in a form of an array, wherein the row of the pixel units comprise at least two pixel units arranged in a second direction in a form of an array;
   at least two columns of pixel units arranged in the second direction in a form of an array, wherein the column of the pixel units comprise the at least two pixel units arranged in the first direction in a form of an array;

wherein the pixel unit comprises:
  a trunk electrode, the pixel unit being divided into at least four pixel partitions by the trunk electrode;
  at least four strip electrode arrays, disposed on the pixel partitions, and comprising at least two strip electrodes; and
  at least four connection electrodes, disposed on the pixel partitions, and connected with at least two of the strip electrodes on the pixel partitions, and the connection electrodes used for increasing transmission of the pixel unit, wherein the strip electrode in each pixel partition extends from the trunk electrode toward a periphery of the pixel partition, and the connection electrode in each pixel partition is separated from the periphery of the pixel partition by a distance; and
  in the pixel partition, an angle between a length direction of the connection electrode and a length direction of the strip electrode is in a range of 1 degree and 89 degrees.

6. The thin film transistor array substrate as claimed in claim 5, wherein the angle is 45 degrees.

7. The thin film transistor array substrate as claimed in claim 5, wherein the length direction of the connection electrode is parallel to the first direction.

8. The thin film transistor array substrate as claimed in claim 5, wherein the length direction of the connection electrode is parallel to the second direction.

9. The thin film transistor array substrate as claimed in claim 5, wherein length directions of the connection electrodes in any two of the pixel units in the same row of the pixel units are the same, and the length directions of the connection electrodes in any two of the pixel units in the same column of the pixel units are the same; or
  the length directions of the connection electrodes in any two of the pixel units in the same row of the pixel units are the same, and the length directions of the connection electrodes in any two of the pixel units in the same column of the pixel units are perpendicular to each other; or,
  the length directions of the connection electrodes in any two of the pixel units in the same row of the pixel units are perpendicular to each other, and the length directions of the connection electrodes in any two of the pixel units in the same column of the pixel units are perpendicular to each other.

10. The thin film transistor array substrate as claimed in claim 5, wherein the connection electrode is used for increasing a total area occupied by a pixel electrode in the pixel unit, thereby increasing, an electric field force applied by the pixel electrode to liquid crystal molecule in a liquid crystal layer.

11. The thin film transistor array substrate as claimed in claim 10, wherein the connection electrode is also used for reducing electric field interference between any two of the strip electrodes in the pixel partition.

12. A display panel, comprising:
  a color film substrate;
  a liquid crystal layer;
  a thin film transistor array substrate, comprising:
    at least two rows of pixel units arranged in a first direction in a form of an array, wherein the row of the pixel units comprise at least two pixel units arranged in a second direction in a form of an array;
    at least two columns of pixel units arranged in the second direction in a form of an array, wherein the column of the pixel units comprise the at least two pixel units arranged in the first direction in a form of an array;
    wherein the pixel unit comprises:
      a trunk electrode, the pixel unit being divided into at least four pixel partitions by the trunk electrode;
      at least four strip electrode arrays, disposed on the pixel partitions, and comprising at least two strip electrodes; and
      at least four connection electrodes, disposed on the pixel partitions, and connected with at least two of the strip electrodes on the pixel partitions, and the connection electrodes used for increasing transmission of the pixel unit, wherein the strip electrode in each pixel partition extends from the trunk electrode toward a periphery of the pixel partition, and the connection electrode in each pixel partition is separated from the periphery of the pixel partition by a distance; and
      in the pixel partition, an angle between a length direction of the connection electrode and a length direction of the strip electrode is in a range of 1 degree and 89 degrees.

13. The display panel as claimed in claim 12, wherein the angle is 45 degrees.

14. The display panel as claimed in claim 12, wherein the length direction of the convection electrode is parallel to the first direction.

15. The display panel as claimed in claim 12, wherein the length direction of the connection electrode is parallel to the second direction.

16. The display panel as claimed in claim 12 wherein length directions of the connection electrodes in any two of the pixel units in the same row of the pixel units are the same, and the length directions of the connection electrodes in any two of the pixel units in the same column of the pixel units are the same; or
  the length directions of the connection electrodes in any two of the pixel units in the same row of the pixel units are the same, and the length directions of the connection electrodes in any two of the pixel units in the same column of the pixel units are perpendicular to each other; or
  the length directions of the connection electrodes in any two of the pixel units in the same row of the pixel units are perpendicular to each other, and the length directions of the connection electrodes in any two of the pixel units in the same column of the pixel units are perpendicular to each other.

17. The display panel as claimed in claim 12, wherein the connection electrode is used for increasing a total area occupied by a pixel electrode in the pixel unit, thereby increasing an electric field force applied by the pixel electrode to liquid crystal molecule in the liquid crystal layer.

18. The display panel as claimed in claim 17, wherein the connection electrode is also used for reducing electric field interference between any two of the strip electrodes in the pixel partition.

* * * * *